US008599910B2

(12) United States Patent
Nagatani et al.

(10) Patent No.: US 8,599,910 B2
(45) Date of Patent: Dec. 3, 2013

(54) JITTER ADDITION APPARATUS AND TEST APPARATUS (75) Inventors: Kenichi Nagatani, Gunma (JP); Takayuki Nakamura, Saitama (JP)

(73) Assignee: Advantest Corporation, Tokyo (JP)

( * ) Notice: Subject to any disclaimer, the term of this patent is extended or adjusted under 35 U.S.C. 154(b) by 577 days.

(21) Appl. No.: 12/629,400

(22) Filed: Dec. 2, 2009

(65) Prior Publication Data
US 2010/0158092 A1 Jun. 24, 2010

(30) Foreign Application Priority Data
Dec. 10, 2008 (JP) .................................. 2008-314744

(51) Int. Cl.
H04B 3/46 (2006.01)
(52) U.S. Cl.
USPC ............ 375/226; 375/224; 375/225; 375/228; 702/69; 324/527
(58) Field of Classification Search
CPC ............... G01R 31/31709; G01R 31/31917; G01R 29/26; G01R 31/3183; G01R 31/2882; G01R 31/31725; G01R 31/31937; G06F 1/10; H04B 3/462; H04L 1/205
USPC .............. 375/224–226, 228; 702/69; 324/527
See application file for complete search history.

(56) References Cited

U.S. PATENT DOCUMENTS

| | | | | |
|---|---|---|---|---|
| 5,656,947 A | * | 8/1997 | Opris | 326/26 |
| 6,167,528 A | * | 12/2000 | Arcoleo | 713/501 |
| 6,556,934 B2 | * | 4/2003 | Higashide | 702/89 |
| 6,983,032 B2 | * | 1/2006 | Mujica et al. | 375/375 |
| 6,998,893 B2 | * | 2/2006 | Takahashi et al. | 327/170 |
| 7,518,169 B2 | * | 4/2009 | Taddiken | 257/288 |
| 7,620,857 B2 | * | 11/2009 | Kho | 714/700 |
| 2001/0026161 A1 | * | 10/2001 | Furukawa | 324/679 |
| 2002/0174159 A1 | | 11/2002 | Laquai | |
| 2003/0043945 A1 | * | 3/2003 | Mujica et al. | 375/355 |
| 2005/0116759 A1 | | 6/2005 | Jenkins et al. | |
| 2007/0098128 A1 | * | 5/2007 | Ishida et al. | 375/376 |

FOREIGN PATENT DOCUMENTS

| | | |
|---|---|---|
| JP | 2002040108 | 2/2002 |
| JP | 2002368827 A | 12/2002 |
| JP | 2006025114 A | 1/2006 |

OTHER PUBLICATIONS

Corrigan "Skew Definition and jitter Analysis", Feb. 2000, Analog Applications Journal, Texas Instruments,pp. 1-5.*
Agligent Technologies, "Agligent E4887A HDMI TMDS Signal Generator Platform", Data Sheet, P16, found on Internet on Dec. 4, 2008. downloaded from internet on Mar. 5, 2010. Mentioned on p. 1 of as-filed specification as concise explanation of relevance.
JP Office Action/ Search Report and Machine Translation Dated Oct. 23, 2012; Application No. 2008-314744.

* cited by examiner

Primary Examiner — Sophia Vlahos (57) ABSTRACT

Provided is a jitter injection apparatus that injects jitter into a signal, comprising: a plurality of jitter injecting sections that are provided in series in a transmission path that propagates the signal; an output section that selects the signal that is passed from a jitter injecting section at a first stage through a designated jitter injecting section, and outputs the selected signal; and a plurality of branch-path jitter injecting sections that (i) are provided in a plurality of branch paths that propagate the signal output by each jitter injecting section from the transmission path to the output section and (ii) are relays having frequency characteristics of attenuating a high-frequency band more than a low-frequency band.

14 Claims, 8 Drawing Sheets

JITTER ADDITION APPARATUS AND TEST APPARATUS

BACKGROUND

1. Technical Field

The present invention relates to a jitter injection apparatus and a test apparatus.

2. Related Art

A conventional jitter injection apparatus for injecting jitter into a signal is known. For example, Patent Documents 1 and 2 describe a filter for injecting jitter into a signal, and Non-Patent Document 1 describes a cable emulator for injecting jitter into a signal. Conventionally, jitter injection apparatuses such as these are used to perform a jitter tolerance test of a device.

Patent Document 1: Japanese Patent Application Publication No. 2002-368827

Patent Document 2: Japanese Patent Application Publication No. 2006-25114

Non-Patent Document 1: Agilent E4887A HDMI TMDS signal generator platform, data sheet P16, [Online], [Found on Dec. 4, 2008].

However, there is no known jitter injection apparatus that has a simple configuration and can switch the jitter injection amount. Accordingly, when performing a jitter tolerance test that involves switching the jitter injection amount, it is necessary to use a jitter injection apparatus with a complex configuration, which greatly increases the cost.

SUMMARY

Therefore, it is an object of an aspect of the innovations herein to provide a jitter injection apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary jitter injection apparatus may include a jitter injection apparatus that injects jitter into a signal, comprising: a plurality of jitter injecting sections that are provided in series in a transmission path that propagates the signal; and an output section that selects the signal that is passed from a jitter injecting section at a first stage through a designated jitter injecting section, and outputs the selected signal.

According to a second aspect related to the innovations herein, one exemplary test apparatus may include a test apparatus that tests a device under test, comprising: a signal supplying section that supplies a test signal for testing the device under test; a signal acquiring section that acquires a response signal from the device under test; a judging section that judges acceptability of the device under test based on the response signal acquired by the signal acquiring section; and a jitter injection apparatus that injects jitter into the test signal supplied from the signal supplying section to the device under test. The jitter injection apparatus includes a plurality of jitter injecting sections that are provided in series in a transmission path that propagates the test signal; and an output section that selects the test signal that is passed from a jitter injecting section at a first stage through a designated jitter injecting section, and outputs the selected test signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
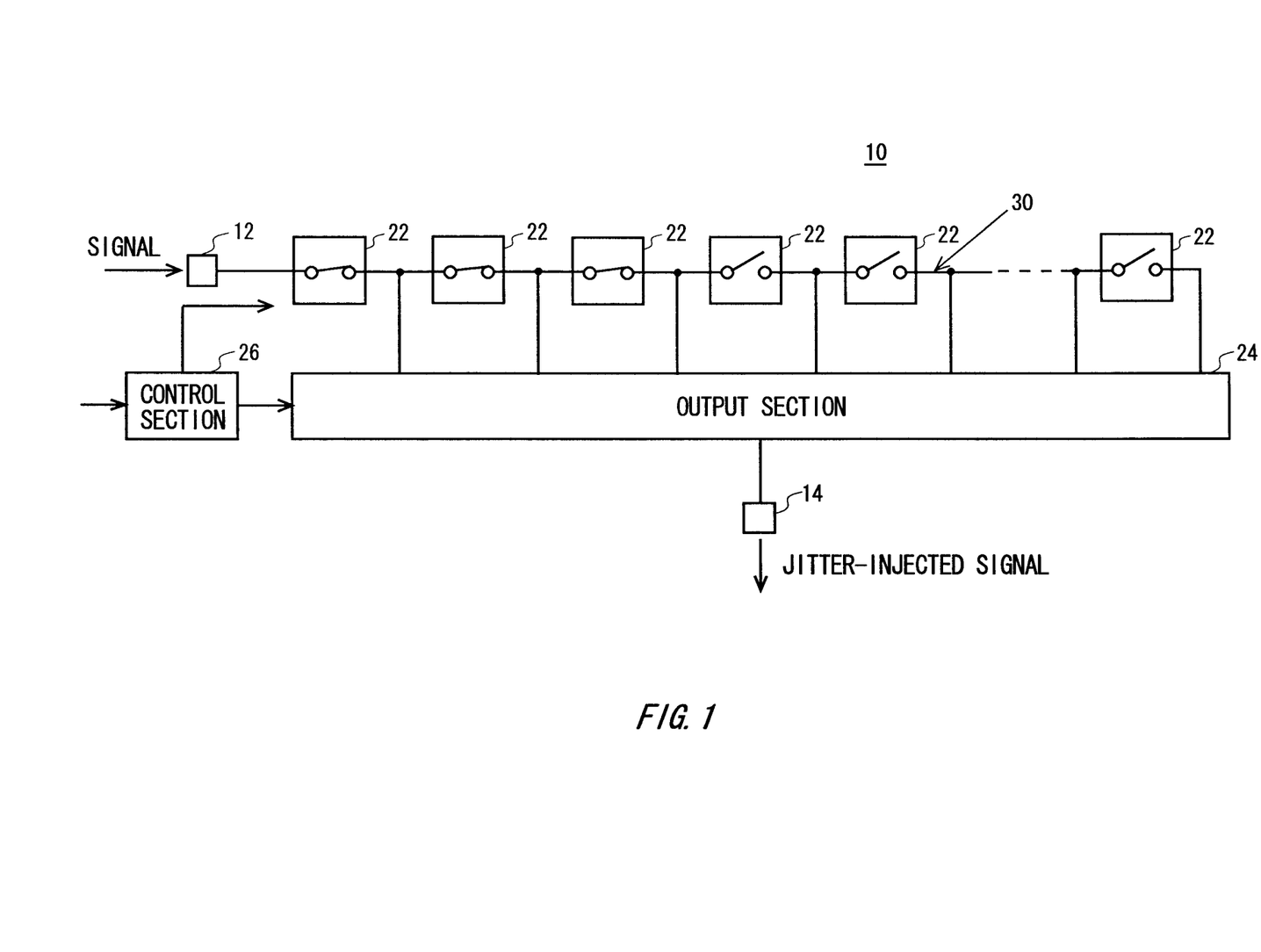
FIG. 1 shows a configuration of a jitter injection apparatus 10 according to an embodiment of the present invention.

FIG. 1 shows a configuration of a jitter injection apparatus 10 according to an embodiment of the present invention. The jitter injection apparatus 10 injects jitter into a signal supplied to an input terminal 12 thereof, and outputs the resulting signal from an output terminal 14 thereof.

The jitter injection apparatus 10 includes a plurality of relays 22, an output section 24, and a control section 26. The relays 22 are provided serially on a transmission path 30 that propagates the signal supplied to the input terminal 12. In other words, the relays 22 are inserted serially in the transmission path 30, and have a dependent connection with each other. The relay 22 that is arranged closest to the input terminal 12 on the transmission path 30 is referred to hereinafter as the first-stage relay 22.

Each relay 22 has a frequency characteristic that has greater attenuation in a high frequency band than in a low frequency band. In other words, each relay 22 may have the characteristics of a low-pass filter. The cutoff frequency of each relay 22 may be higher than the frequency of the signal into which the jitter is to be injected.

These relays 22 each function as a jitter injecting section that injects intersymbol interference jitter into a signal passed therethrough. In other words, each time the signal propagated in the transmission path 30 passes through a relay 22, jitter is superimposed on the signal. Accordingly, each relay 22 outputs a signal having greater intersymbol interference jitter than the signal output by the relay 22 at the previous stage.

Each relay 22 may be a photoMOS relay, for example. A photoMOS relay has a higher tolerance than other types of relays.

Instead of the relays 22, the jitter injection apparatus 10 may include jitter injecting sections with other elements or circuits that have characteristics of greater attenuation at high frequency bands than at low frequency bands. For example, instead of the relays 22, the jitter injection apparatus 10 may include low-pass filters and jitter injecting sections having relays that select whether each low-pass filter is connected to the jitter injecting section at the previous stage.

The output section 24 selects a signal passed from the first-stage relay 22 through a designated relay 22, and outputs this signal from the output terminal 14. For example, the control section 26 may selectively connect an output terminal of one of the relays 22 to the output terminal 14, so that the output section 24 outputs, from the output terminal 14, the signal output from the designated relay 22.

The control section 26 controls the output section 24 and the relays 22. The control section 26 receives a designation indicating one of the relays 22. For example, when increasing the amount of jitter to be injected, the control section 26 receives a designation indicating a relay 22 at a later stage, and when decreasing the amount of jitter to be injected, the control section 26 receives a designation indicating a relay 22 at an earlier stage. The control section 26 controls the output section 24 such that the path between the output end of the designated relay 22 and the output terminal 14 is in a connected state and the paths between the output ends of every relay 22 other than the designated relay 22 and the output terminal 14 are in a disconnected state.

Furthermore, the control section 26 connects the relays 22 from the first-stage relay 22 to the designated relay 22, and disconnects the relay 22 at the stage following the designated relay 22. In this way, the control section 26 can provide the output section 24 with a signal that passes from the first-stage relay 22 through the designated relay 22, without creating a reflected signal from the relays 22 at stages later than the designated relay 22.

Each relay 22 is located closer to (i) the branch path that propagates the signal output by the relay 22 at the previous stage from the transmission path 30 to the output section 24 than to (ii) the branch path that propagates the signal output by the current relay 22 from the transmission path 30 to the output section 24. More desirably, each relay 22 is provided immediately next to the preceding branch path. With the relays 22 positioned in this way, the jitter injection apparatus 10 can prevent reflected signals because the stub formed in the path from the output end of the designated relay 22 toward the output section 24 is decreased.

The control section 26 may be provided outside of the jitter injection apparatus 10. In other words, the plurality of relays 22 and the output section 24 may be directly controlled from an external control apparatus or the like.

Figure 2:
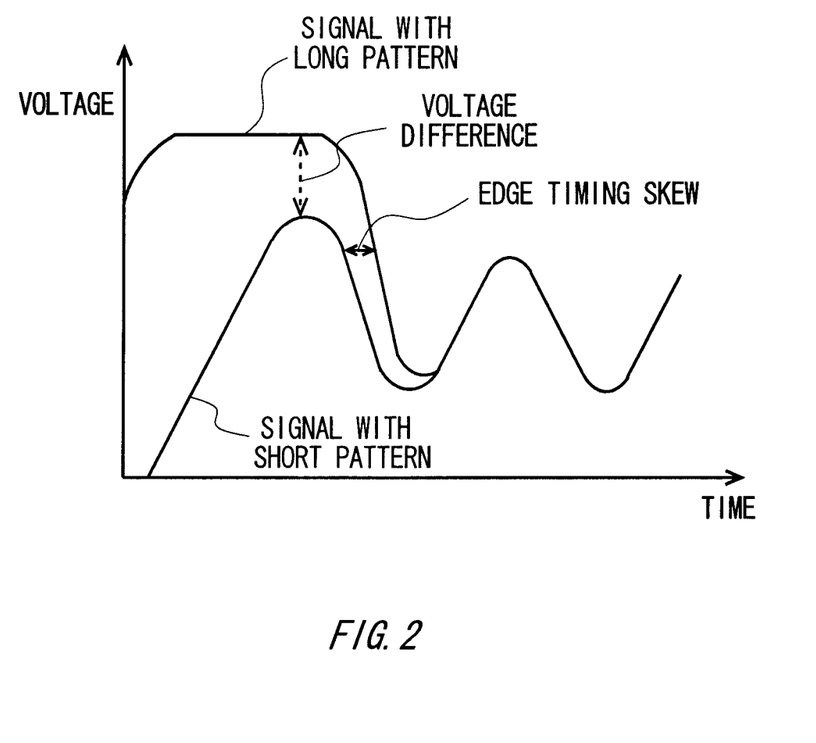
FIG. 2 shows a waveform of a signal passed through the transmission line.

FIG. 2 shows a waveform of a signal passed through the transmission line. The signal passed through the transmission line has a high frequency component removed therefrom and the amplitude of the high portion of the frequency component is decreased. Accordingly, the signal passed through the transmission line has increased peak voltage at a long portion of the pattern and has decreased voltage at a short portion of the pattern. The voltage difference caused by the difference in pattern length causes a skew in the edge timing at which the logic inverts, which causes intersymbol interference.

The jitter injection apparatus 10 passes the received signal through the relays 22 having frequency characteristics to attenuate high-frequency bands, and outputs the resulting signal. Accordingly, the jitter injection apparatus 10 can output the signal supplied thereto after injecting intersymbol interference jitter that is identical to the effect of passage through the transmission line as shown in FIG. 2.

Figure 3:
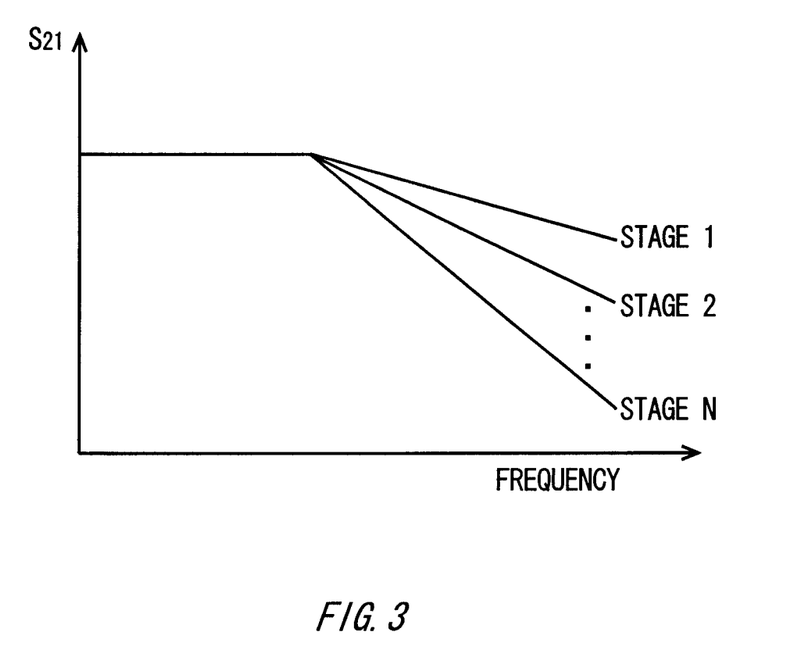
FIG. 3 shows an example of frequency characteristics of the gain of the signal output from the output terminal 14 relative to the signal input to the input terminal 12.

FIG. 3 shows an example of frequency characteristics of the gain of the signal output from the output terminal 14 relative to the signal input to the input terminal 12. The higher the frequency of the input signal, the more the jitter injection apparatus 10 attenuates the passed signal. Furthermore, the greater the number of relays 22 that the signal passes through in the jitter injection apparatus 10, the greater the attenuation amount of the signal. Accordingly, the greater the number of relays 22 that the signal passes through in the jitter injection apparatus 10, the greater the intersymbol interference jitter that is injected to the signal.

As described above, the jitter injection apparatus 10 of the present embodiment can change the amount of jitter injected by the number of relays 22 that the signal passes through. Furthermore, the jitter injection apparatus 10 of the present embodiment injects the jitter using the relays 22, and so has a simple configuration and a low cost. Yet further, this jitter injection apparatus 10 can perform control simply, because the amount of jitter injected into the signal is changed by switching the relays 22.

Figure 4:
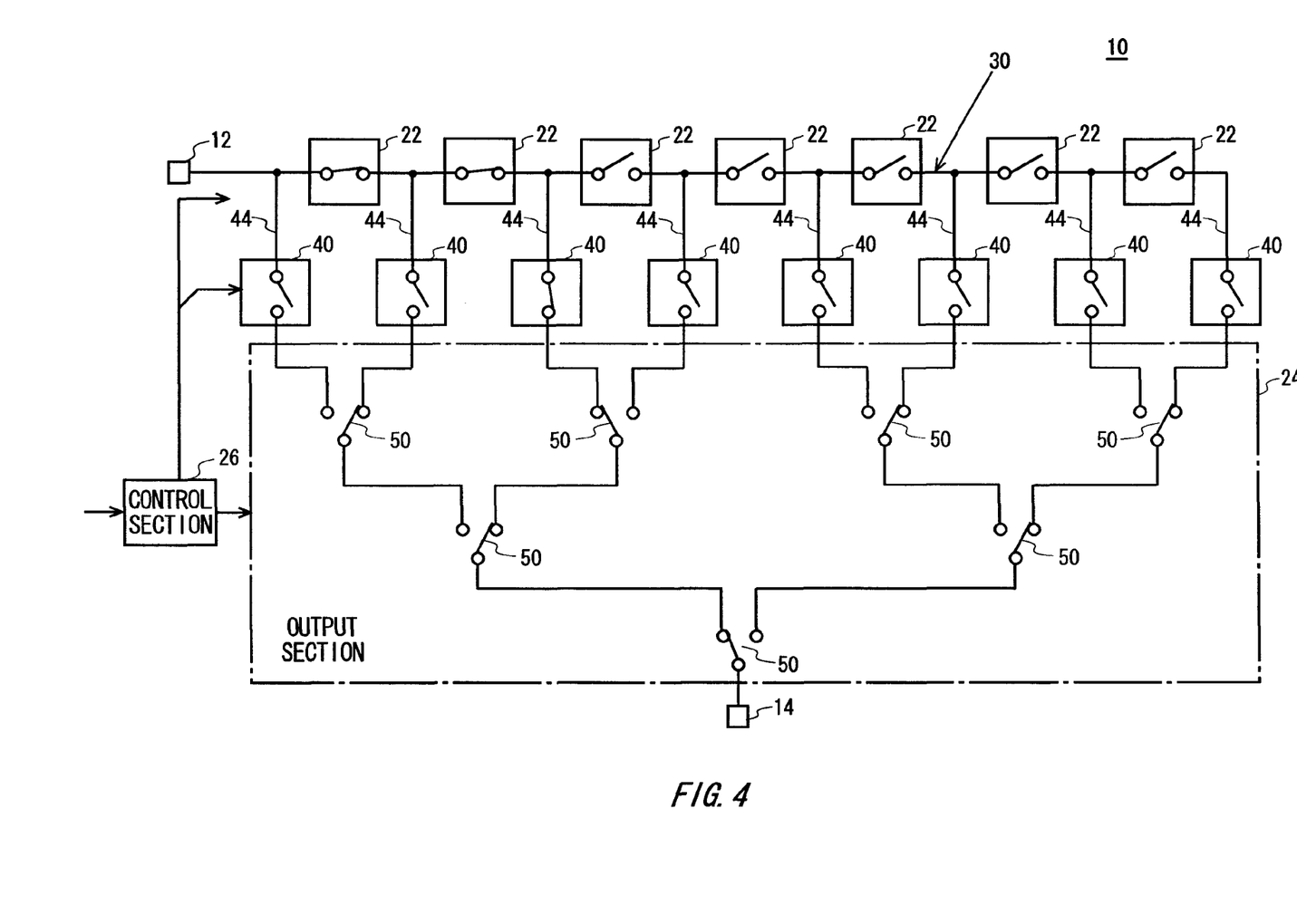
FIG. 4 shows a configuration of the jitter injection apparatus 10 according to a modification of the present embodiment.

FIG. 4 shows a configuration of the jitter injection apparatus 10 according to a modification of the present embodiment. The jitter injection apparatus 10 of the present modification adopts the same function and configuration as the jitter injection apparatus 10 shown in FIG. 1, and components of the jitter injection apparatus 10 of the present modification adopt the same function and configuration as components having the same reference numeral in the jitter injection apparatus 10 shown in FIG. 1. Therefore, the following description includes only differing points.

The jitter injection apparatus 10 further includes a plurality of branch-path relays 40. The branch-path relays 40 are provided respectively in the plurality of branch paths 44 that propagate the signal output by each relay 22 from the transmission path 30 to the output section 24. The jitter injection apparatus 10 may further include a branch-path relay 40 provided in the branch path 44 that propagates the signal input to the input terminal 12, i.e. the signal input to the first-stage relay 22, from the transmission path 30 to the output section 24.

Each branch-path relay 40 has a frequency characteristic for greater attenuation of a high-frequency band than of a low-frequency band. The branch-path relays 40 and the relays 22 may be the same type of relays.

Each of these branch-path relays 40 functions as a branch-path jitter injecting section that injects intersymbol interference jitter into the signal passing therethrough. In other words, the signal propagated in a branch path 44 has jitter superimposed thereon by a branch-path relay 40. Accordingly, each branch-path relay 40 outputs a signal that has greater intersymbol interference jitter than the signal output from the corresponding relay 22 and the signal input to the branch-path relay 40.

In addition to the relays 22 and the output section 24, the control section 26 may also control the branch-path relays 40. For example, the control section 26 may control the branch-path relay 40 in the branch path 44 propagating the signal output by the designated relay 22 to be in a connected state, and control the branch-path relays 40 in the branch paths 44 propagating the signal output by the relays 22 at stages before the designated relay 22 to be in a disconnected state. In this way, the control section 26 can supply the output section 24 with the signal passed through the designated relay 22.

Each branch-path relay 40 is positioned closer to the transmission path 30 than to the input end of the output section 24. More desirably, each branch-path relay 40 is positioned immediately next to the transmission path 30. The branch-path relays 40 positioned in this way decrease the stub formed in the transmission path 30, thereby preventing a reflected signal from the branch paths whose branch-path relays 40 are in a disconnected state.

The output section 24 connects the output end of each relay 22 to the output terminal 14 of the jitter injection apparatus 10 via paths that have the same characteristics. For example, the output section 24 may have a tree-structured switch array that selectively connects the output end of each relay 22 to the output terminal 14. For example, the output section 24 may have a switch array in which two-connection switches 50 are connected in a tree structure. With such a switch array, the number of switches inserted from the output end of each relay 22 to the output terminal 14 can be equal, so that all of the paths from the output end of each relay 22 to the output terminal 14 have the same characteristics.

Figure 5:
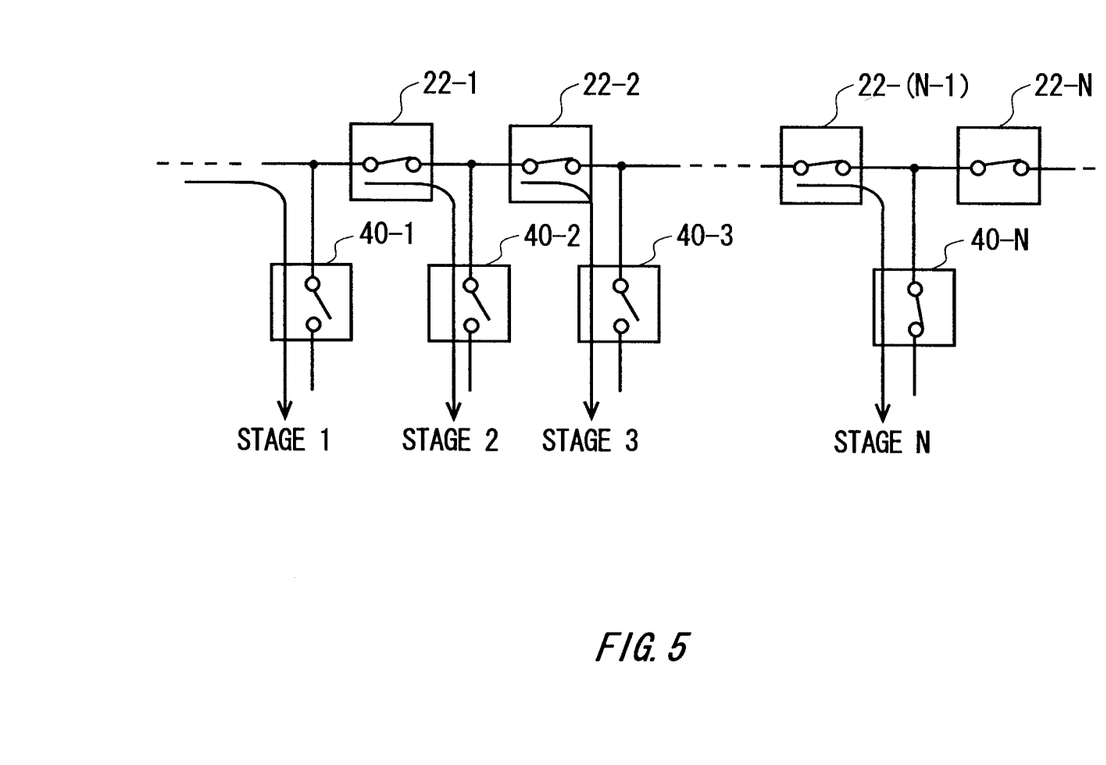
FIG. 5 shows exemplary paths through which the input signal can pass in the jitter injection apparatus 10 shown in FIG. 4.

FIG. 5 shows exemplary paths through which the input signal can pass in the jitter injection apparatus 10 shown in FIG. 4. In the jitter injection apparatus 10 of the present modification shown in FIG. 4, when a signal that has passed through one relay stage is output, the control section 26 disconnects at least the first-stage relay 22-1. Furthermore, in this case, the control section 26 connects the first branch-path relay 40-1 provided in the branch path 44 that propagates the signal input to the input terminal 12 to the output section 24.

When a signal passed through two relay stages is output, the control section 26 connects the first-stage relay 22-1 and disconnects the second-stage relay 22-2. Furthermore, in this case, the control section 26 disconnects the first branch-path relay 40-1, and connects the second branch-path relay 40-2 provided in the branch path 44 that propagates the signal output by the first-stage relay 22-1 to the output section 24.

When a signal passed through N relay stages is output, where N is an integer greater than 2, the control section 26 connects each relay 22 from the first stage to stage N−1. The relay 22-N may be disconnected. Furthermore, in this case, the control section 26 disconnects each branch-path relay 40 from the first to the (N−1)th, and connects the Nth branch-path relay 40-N. In this way, the jitter injection apparatus 10 of the present modification can easily change the jitter amount injected to the signal by switching the number of relay stages that the signal passes through.

Figure 6:
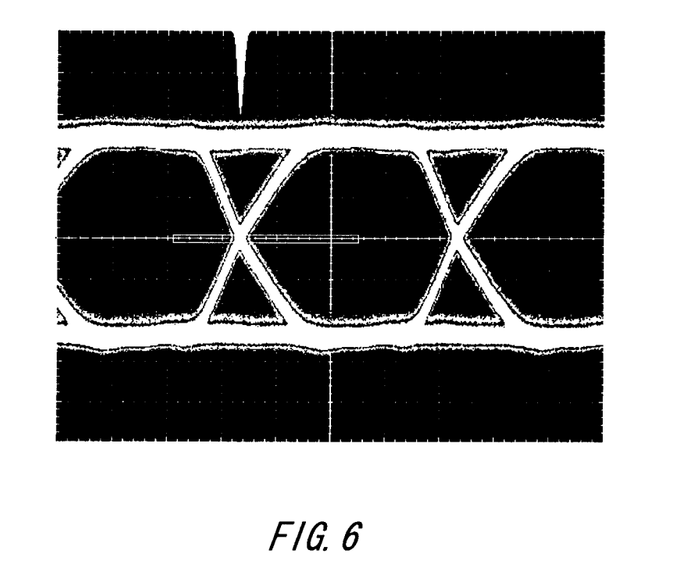
FIG. 6 shows the eye pattern of the signal passed through one relay stage and output by the jitter injection apparatus 10 of the present embodiment.
Figure 7:
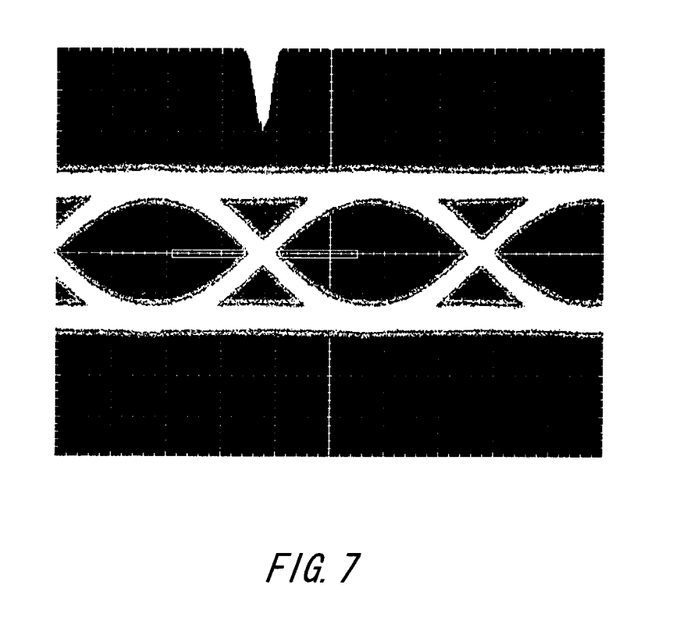
FIG. 7 shows the eye pattern of the signal passed through four relay stages and output by the jitter injection apparatus 10 of the present embodiment.
Figure 8:
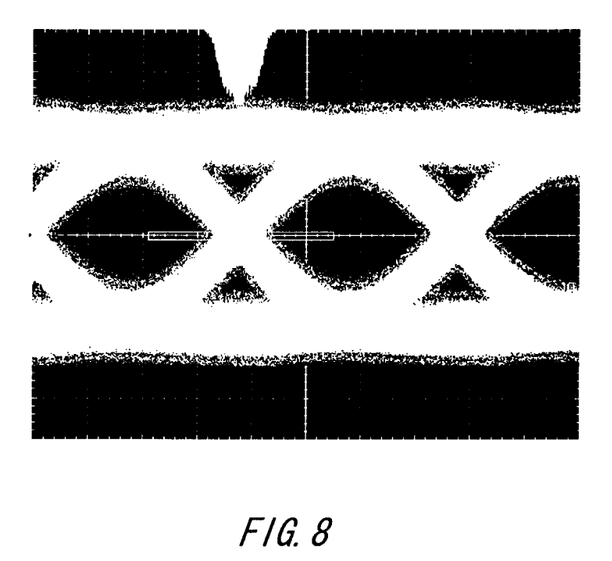
FIG. 8 shows the eye pattern of the signal passed through six relay stages and output by the jitter injection apparatus 10 of the present embodiment.
Figure 9:
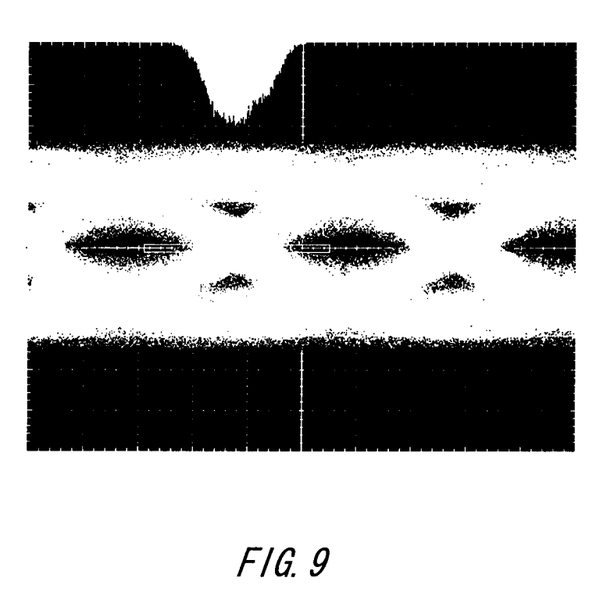
FIG. 9 shows the eye pattern of the signal passed through ten relay stages and output by the jitter injection apparatus 10 of the present embodiment.

FIGS. 6 to 9 show exemplary eye patterns of the signal output by the jitter injection apparatus 10 of the present embodiment when a pseudorandom signal (PRBS signal) is supplied thereto. FIG. 6 shows the eye pattern of the signal passed through one relay stage. FIG. 7 shows the eye pattern of the signal passed through four relay stages. FIG. 8 shows the eye pattern of the signal passed through seven relay stages. FIG. 9 shows the eye pattern of the signal passed through ten relay stages.

As shown in FIGS. 6 to 9, the jitter injection apparatus 10 can increase the amount of jitter injected into the signal by passing the signal through a greater number of relay stages. Furthermore, during a calibration process, the jitter injection apparatus 10 may use an oscilloscope or the like to measure the jitter amount at each relay stage, and store the measurement results in association with the relay stages in a memory or the like. Then, during normal operation, the jitter injection apparatus 10 may receive a jitter amount designation and inject the jitter of a number of relay stages corresponding to the designated jitter amount. In this way, the jitter injection apparatus 10 can inject a more accurate jitter amount into the signal.

Figure 10:
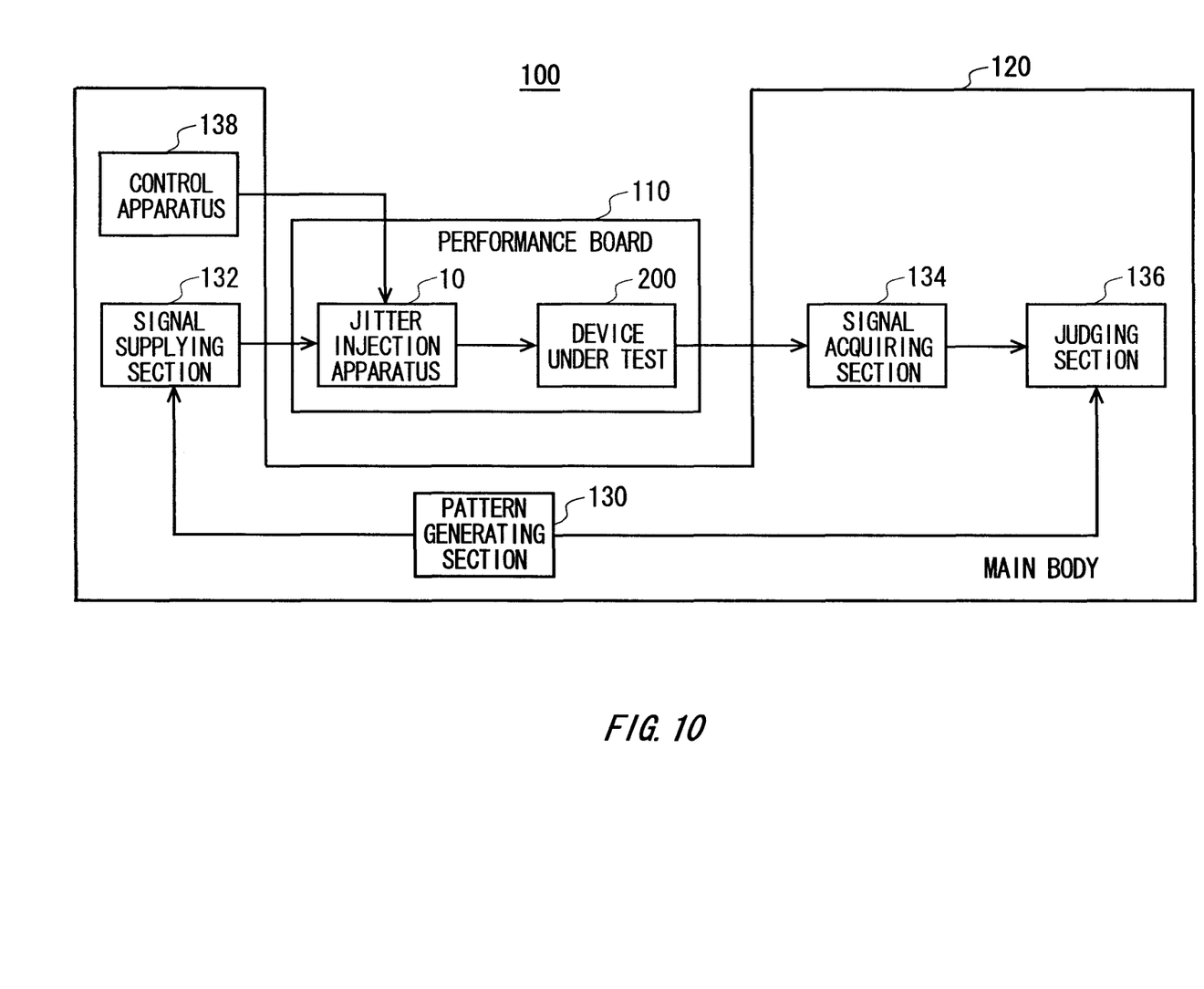
FIG. 10 shows a configuration of a test apparatus 100 according to an embodiment of the present invention, along with a device under test 200.

FIG. 10 shows a configuration of a test apparatus 100 according to an embodiment of the present invention, along with a device under test 200. The test apparatus 100 tests the device under test 200. More specifically, the test apparatus 100 performs a jitter tolerance test of the device under test 200.

The test apparatus 100 includes a performance board 110 and a main body 120. The performance board 110 may be mounted on the main body 120, for example. The device under test 200 is then loaded onto the performance board 110.

The performance board 110 includes the jitter injection apparatus 10. The jitter injection apparatus 10 injects jitter into a test signal supplied from the main body 120 to the device under test 200. The jitter injection apparatus 10 has the same function and configuration as any one of the jitter injection apparatuses 10 described in relation to FIGS. 1 to 9. In the test apparatus 100, instead of the performance board 110 including the jitter injection apparatus 10, the main body 120 may include the jitter injection apparatus 10.

The test apparatus 100 includes a pattern generator 130, a signal supplying section 132, a signal acquiring section 134, a judging section 136, and a control apparatus 138. The pattern generator 130 generates a test pattern for testing the device under test 200. Furthermore, the pattern generator 130 generates an expected value of the signal output by the device under test 200.

The signal supplying section 132 supplies the device under test 200 with a test signal corresponding to the test pattern generated by the pattern generator 130, via the jitter injection apparatus 10. The signal acquiring section 134 acquires a response signal that is output by the device under test 200 in response to the test signal supplied thereto.

The judging section 136 judges the acceptability of the device under test 200 based on the acquisition by the signal acquiring section 134. For example, the judging section 136 compares the logic value of the response signal to the expected value supplied from the pattern generator 130, and outputs the comparison result.

The control apparatus 138 controls the jitter amount injected into the test signal by the jitter injection apparatus 10. For example, the control apparatus 138 may control the jitter injection apparatus 10 to inject the test signal with a jitter amount designated according to a test program or the like. This test apparatus 100 can test the device under test 200 by outputting a jitter-injected test signal to the device under test 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A jitter injection apparatus that injects jitter into a signal, comprising:
   a plurality of jitter injecting sections that are provided in series in a transmission path that propagates the signal, each jitter injecting section including a relay that has a frequency characteristic of attenuating a high-frequency band more than a low-frequency band;
   an output section that outputs, to an output terminal of the jitter injection apparatus, the signal at an output of a designated jitter injecting section;
   a control section that controls the relay of the designated jitter injecting section and any existing relay of any existing jitter injecting section preceding the designated jitter injecting section to be in a connected state and controls any existing relay of any existing jitter injecting section immediately following the designated jitter injecting section to be in a disconnected state; and
   a plurality of branch-path jitter injecting sections that (i) are provided in a plurality of branch paths each of which propagates the signal at an output of an associated one of the jitter injecting sections from the transmission path to the output section and (ii) include relays having frequency characteristics of attenuating a high-frequency band more than a low-frequency band, wherein
   the control section controls the branch-path jitter injecting section on the branch path that propagates the signal at the output of the designated jitter injecting section to be in a connected state, and controls any existing, branch-path jitter injecting sections on any existing, branch paths that propagate the signal at outputs of any existing, jitter injecting sections preceding the designated jitter injecting section to be in a disconnected state.

2. A jitter injection apparatus that injects jitter into a signal, comprising:
   a plurality of jitter injecting sections that are provided in series in a transmission path that propagates the signal, each jitter injecting, section including a relay that has a frequency characteristic of attenuating a high-frequency band more than a low-frequency band, each relay having an input end and an output end, the input ends of relays of the jitter injecting sections other than a first jitter injecting section being connected to the output end of a relay of an immediately preceding jitter injecting section, the output ends of relays of the jitter injecting sections other than a last jitter injecting section being connected to the input end of a relay of an immediately following jitter injecting section, and each of the relays having a connected state in which the input end and the output end of the relay are substantially connected to each other and a disconnected state in which the input end and the output end of the relay are substantially disconnected from each other; and
   an output section that outputs, to an output terminal of the jitter injection apparatus, the signal at an output of a designated jitter injecting section, wherein
   the output section connects output ends of the jitter injecting sections to the output terminal of the jitter injection apparatus via paths that each have the same frequency characteristic.

3. The jitter injection apparatus according to claim 2, further comprising
   a control section that controls the relay of the designated jitter injecting section and any existing relay of any existing jitter injecting section preceding the designated jitter injecting section to be in the connected state and controls any existing relay of any existing jitter injecting section immediately following the designated jitter injecting section to be in the disconnected state.

4. The jitter injection apparatus according to claim 2, wherein
   a plurality of branch paths each propagate the signal at an output of an associated one of the jitter injecting sections from the transmission path to the output section, and
   each jitter injecting section is provided closer to (i) any existing, branch path that propagates the signal at the output of any existing jitter injecting section immediately preceding the jitter injecting section than to (ii) the branch path that propagates the signal output by the jitter injecting section.

5. The jitter injection apparatus according to claim 2, wherein
   the output section has a tree-structured switch array, in which a plurality of inputs of the output section converge to a single output of the output section, that selectively connects the output end of each jitter injecting section to the output terminal of the jitter injection apparatus.

6. The jitter injection apparatus according to claim 2, wherein
   each relay is a photoMOS relay.

7. The jitter injection apparatus according to claim 2, further comprising
   a control section that controls the output section such that as path between an output end of the designated jitter injecting section and the output terminal of the jitter injection apparatus is in a connected state and paths between output ends of every jitter injecting section other than the designated jitter injecting section and the output terminal of the jitter injection apparatus are in a disconnected state.

8. The jitter injection apparatus according to claim 3, wherein
   the control section further controls the output section such that a path between an output end of the designated jitter injecting section and the output terminal of the jitter injection apparatus is in a connected state and paths between output ends of every jitter injecting section other than the designated jitter injecting section and the output terminal of the jitter injection apparatus are in a disconnected state.

9. The jitter injection apparatus according to claim 5, wherein
   the tree-structured switch array has a hierarchical structure of two or more levels.

10. The jitter injection apparatus according to claim 5, wherein
    the tree-structured switch array includes a plurality of double-throw switches.

11. The jitter injection apparatus according to claim 2, wherein
    each of the paths via which the output section connects the output ends of the jitter injecting section to the output terminal of the jitter injection apparatus has a number of switches, and the number of switches that each of the paths has is the same.

12. A jitter injection apparatus that injects into a signal, comprising:
    a plurality of jitter injecting sections that are provided in series in a transmission path that propagates the signal, each jitter injecting section including a low-pass filter and a relay that selects whether the low-pass filter of the jitter injecting section is connected to any existing immediately preceding jitter injecting section, each jitter injecting section having an input end and an output end, the input ends of the jitter injecting sections other than a first jitter injecting section being, connected to the output end of an immediately preceding jitter injecting section, the output ends of the jitter injecting sections other than a last jitter injecting section being connected to the input end of an immediately following jitter injecting section, and the relay of each jitter injecting section having a connected state in which the low-pass filter of the jitter injecting section is connected to any existing immediately preceding jitter injecting section and a disconnected state in which the low-pass filter of the jitter injecting section is disconnected from any existing immediately preceding jitter injecting section; and an output section that outputs, to an output terminal of the jitter injection apparatus, the signal at an output of a designated jitter injecting section, wherein the output section connects output ends of the jitter injecting sections to the output terminal of the jitter injection apparatus via paths that each have the same frequency characteristic.

13. A test apparatus that tests a device under test, comprising:
    a signal supplying section that supplies a test signal for testing the device under test;
    a signal acquiring section that acquires a response signal from the device under test;
    a judging section that judges acceptability of the device under test based on the response signal acquired by the signal acquiring section; and
    a jitter injection apparatus that injects jitter into the test signal supplied from the signal supplying section to the device under test, wherein the jitter injection apparatus includes:

a plurality of jitter injecting sections that are provided in series in a transmission path that propagates the test signal, each jitter injecting section including a relay that has a frequency characteristic of attenuating a high-frequency band more than a low-frequency band, each relay having an input end and an output end, the input ends of relays of the jitter injecting section other than a first jitter injecting section being connected to the output end of a relay of an immediately preceding jitter injecting section, the output ends of relays of the jitter injecting sections other than a last jitter injecting section being, connected to the input end of an immediately following jitter injecting section, and each of the relays having a connected state in which the input end and the output end of the relay are substantially connected to each other and a disconnected state in which the input end and the output end of the relay are substantially disconnected from each other; and an output section that outputs, to an output terminal of the jitter injection apparatus, the test signal at an output of a designated jitter injecting section, and the output section connects output ends of the jitter injecting sections to the output terminal of the jitter injection apparatus via paths that each have the same frequency characteristic.

14. The test apparatus according to claim 13, wherein
    each of the paths via which the output section connects the output ends of the jitter injecting section to the output terminal of the jitter injection apparatus has a number of switches, and the number of switches that each of the paths has is the same.

* * * * *